United States Patent
Chen et al.

(10) Patent No.: US 10,541,298 B2
(45) Date of Patent: *Jan. 21, 2020

(54) ETCHING PROCESS CONTROL IN FORMING MIM CAPACITOR

(71) Applicant: Taiwan Semiconductor Manufacturing Company, Ltd., Hsinchu (TW)

(72) Inventors: Hung-Hao Chen, Hsinchu (TW); Che-Cheng Chang, New Taipei (TW); Wen-Tung Chen, Taipei (TW); Yu-Cheng Liu, Zhubei (TW); Horng-Huei Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/016,908

(22) Filed: Jun. 25, 2018

(65) Prior Publication Data

US 2018/0301526 A1 Oct. 18, 2018

Related U.S. Application Data

(63) Continuation of application No. 15/420,660, filed on Jan. 31, 2017, now Pat. No. 10,008,559.

(60) Provisional application No. 62/312,787, filed on Mar. 24, 2016, provisional application No. 62/323,186, filed on Apr. 15, 2016.

(51) Int. Cl.
*H01L 49/02* (2006.01)

(52) U.S. Cl.
CPC .............. *H01L 28/60* (2013.01); *H01L 28/55* (2013.01); *H01L 2224/11* (2013.01)

(58) Field of Classification Search
CPC ..... H01L 28/65; H01L 28/75; H01L 23/5223; H01L 23/53252; H01L 2924/0002; H01L 2924/00; H01L 27/1255; H01L 27/1288; H01L 27/125; H01L 28/60; H01L 28/55; H01L 2224/11; H01L 28/40
See application file for complete search history.

(56) References Cited

U.S. PATENT DOCUMENTS

| | | | |
|---|---|---|---|
| 6,777,777 B1 | 8/2004 | Kar-Roy et al. | |
| 7,001,821 B2 * | 2/2006 | Aggarwal | H01L 21/32139 257/295 |
| 8,796,044 B2 | 8/2014 | Beecher et al. | |
| 10,008,559 B2 * | 6/2018 | Chen | H01L 28/55 |

(Continued)

FOREIGN PATENT DOCUMENTS

CN 103700765 A 4/2014

*Primary Examiner* — Selim U Ahmed
(74) *Attorney, Agent, or Firm* — Slater Matsil, LLP

(57) ABSTRACT

A method includes forming a capacitor, which includes depositing a bottom electrode layer, depositing a capacitor insulator layer over the bottom electrode layer, depositing a top electrode layer over the capacitor insulator layer, and depositing a dielectric layer over the top electrode layer. The dielectric layer is etched using a process gas until the top electrode layer is exposed. In the etching of the dielectric layer, the dielectric layer has a first etching rate, and the top electrode layer has a second etching rate, and a ratio of the first etching rate to the second etching rate is higher than about 5.0.

20 Claims, 15 Drawing Sheets

(56) References Cited

U.S. PATENT DOCUMENTS

| | | | |
|---|---|---|---|
| 2004/0173570 A1* | 9/2004 | Ying | B82Y 10/00 |
| | | | 216/63 |
| 2005/0054122 A1 | 3/2005 | Celii et al. | |
| 2007/0188976 A1 | 8/2007 | Nakayama | |
| 2010/0091424 A1 | 4/2010 | Loh et al. | |
| 2010/0276783 A1 | 11/2010 | Cathey et al. | |
| 2011/0108951 A1* | 5/2011 | Cho | H01L 21/31144 |
| | | | 257/532 |
| 2013/0256837 A1 | 10/2013 | Shin | |
| 2014/0104745 A1* | 4/2014 | Zheng | H01G 4/33 |
| | | | 361/275.1 |
| 2015/0048483 A1 | 2/2015 | Kuo et al. | |
| 2015/0295020 A1 | 10/2015 | Tseng et al. | |
| 2017/0256605 A1* | 9/2017 | Nonaka | H01L 28/65 |

* cited by examiner

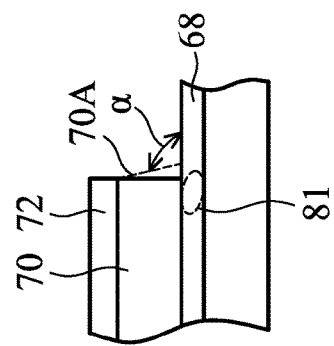
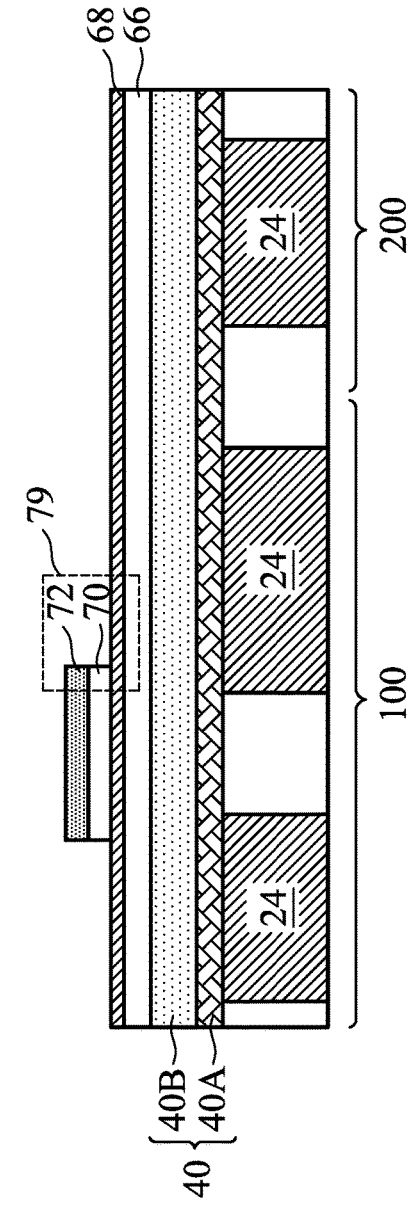
FIG. 6B
FIG. 6A

ETCHING PROCESS CONTROL IN FORMING MIM CAPACITOR

PRIORITY CLAIM AND CROSS-REFERENCE

This application is a continuation a U.S. patent application Ser. No. 15/420,660, filed Jan. 31, 2017, and entitled "Etching Process Control in Forming MIM Capacitor," which claims the benefit of the following provisionally filed U.S. Patent application: Application Ser. No. 62/312,787, filed Mar. 24, 2016, and entitled "MIM Reliability Improvement by Precisely Profile Control;" and provisionally filed U.S. Patent application: Application Ser. No. 62/323,186, filed Apr. 15, 2016, and entitled "Reducing IC Operation Signal noise and Stabilizing Power in High Speed Application by MIM Process;" which applications are hereby incorporated herein by reference.

BACKGROUND

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

Decoupling capacitors are used to decouple some parts of electrical networks from others. Noise caused by certain circuit elements is shunted through the decoupling capacitors, hence reducing the effect of the noise-generating circuit elements on adjacent circuits. In addition, Decoupling capacitors are also used in power supplies, so that the power supplies may accommodate the variations in current-draw, so that the variation in power supply voltage is minimized. When the current-draw in a device changes, the power supply itself cannot respond to the change instantaneously. The decoupling capacitors thus may act as power storages to maintain power supply voltages in response to the current-draw at frequencies ranging from hundreds of kilo-hertz to hundreds of mega-hertz.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 14 illustrate cross-sectional views of intermediate stages in the formation of a capacitor in a wafer in accordance with some embodiments.

DETAILED DESCRIPTION

Figure 1:
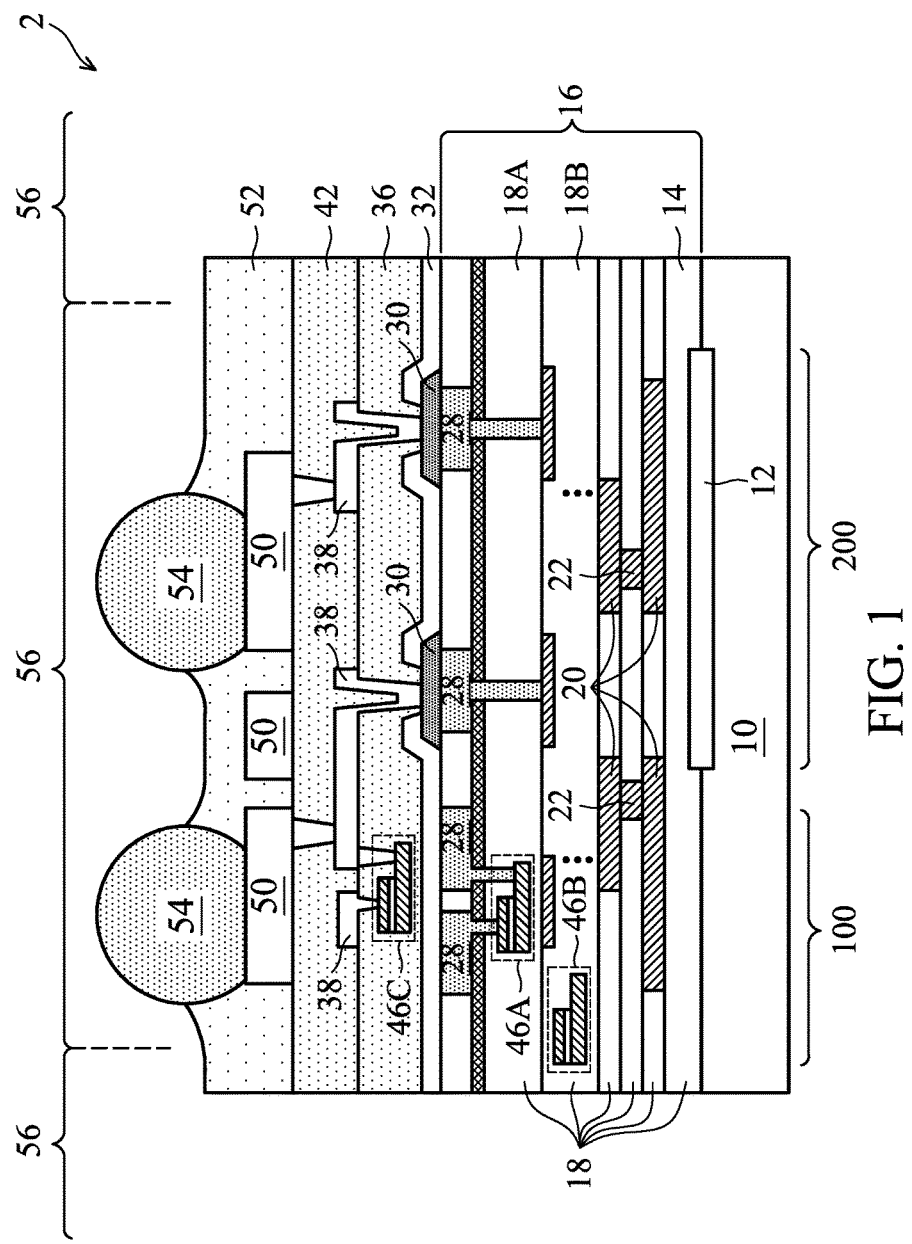
FIG. 1 illustrates a cross-sectional view of a device die including a capacitor(s) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device die/wafer including a capacitor and the method of forming the same are provided in accordance with some exemplary embodiments. The intermediate stages of forming the capacitor are illustrated. The variations of the embodiments are discussed. Throughout the various views and illustrative embodiments, like reference numbers are used to designate like elements.

Referring to FIG. 1, wafer 2, which includes semiconductor substrate 10, is provided. In accordance with some embodiments of the present disclosure, semiconductor substrate 10 is a bulk silicon substrate or a silicon-on-insulator substrate. In accordance with alternative embodiments of the present disclosure, other semiconductor materials that include group III, group IV, and/or group V elements may also be used, which may include silicon germanium, silicon carbon, and/or III-V compound semiconductor materials. Integrated circuit devices such as transistors (schematically illustrated as 12) are formed at a surface of semiconductor substrate 10. Wafer 2 may further include Inter-Layer Dielectric (ILD) 14 and interconnect structure 16 over semiconductor substrate 10. Interconnect structure 16 includes metal lines 20 and vias 22, which are formed in dielectric layers 18. The metal lines at a same level are collectively referred to as being a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In accordance with some embodiments of the present disclosure, dielectric layers 18 are formed of low-k dielectric materials. The dielectric constants (k values) of the low-k dielectric materials may be lower than about 3.0, or lower than about 2.5, for example.

Metal pads 30 are formed over interconnect structure 16, and may be electrically coupled to integrated circuit devices 12 through metal lines 20 and vias 22. Metal pads 30 may be aluminum pads or aluminum-copper pads, and hence are alternatively referred to as aluminum pads 30 hereinafter, while other metallic materials may be used. For example, metal pads 30 may have an aluminum (atomic) percentage between about 99.5 percent and about 99.9 percent, and a copper percentage between about 0.1 percent and about 0.5 percent. In accordance with some embodiments of the present disclosure, metal pads 30 are in physical contact with the underlying metal lines (or pads) in the top metal layer in interconnect structure 16. For example, as shown in FIG. 1, metal pads 30 have bottom surfaces in contact with the top surfaces of metal pads 28.

As also shown in FIG. 1, passivation layer 32 is formed over interconnect structure 16. Passivation layer 32 has a k value greater than 3.8, and is formed using a non-low-k dielectric material. In accordance with some embodiments of the present disclosure, passivation layer 32 is a composite layer including a silicon oxide layer (not shown), and a silicon nitride layer (not shown) over the silicon oxide layer. Passivation layer 32 may also be formed of other non-porous dielectric materials such as Un-doped Silicate Glass (USG), silicon oxynitride, and/or the like.

Passivation layer 32 is patterned, so that some portions of passivation layer 32 cover the edge portions of aluminum pads 30, and the central portions of aluminum pads 30 are exposed through the openings in passivation layer 32. Passivation layer 32 and metal pads 30 have some portions level with each other in accordance with some embodiments of the present disclosure.

Polymer layer 36 is formed over metal pads 30 and passivation layer 32. Polymer layer 36 is also patterned to form openings, with the central portions of metal pads 30 exposed through the openings in polymer layer 36. In accordance with some embodiments of the present disclosure, polymer layer 36 is formed of polybenzoxazole (PBO). In accordance with alternative embodiments, polymer layer 36 is formed of other polymers such as polyimide, benzocyclobutene (BCB), or the like. The material of polymer layer 36 may be photo sensitive, although non-photo-sensitive materials may also be used.

Post-Passivation Interconnect (PPI) 38 is formed, which includes line portions over polymer layer 36, and via portions extending into polymer layer 36. PPI 38 is thus electrically connected to metal pads 30. PPI 38 may be formed of copper or a copper alloy, for example.

Polymer layer 42 is formed over polymer layer 36 and PPI 38. In accordance with some embodiments of the present disclosure, polymer layer 42 is formed of PBO. In accordance with alternative embodiments, polymer layer 42 is formed of other polymers such as polyimide, BCB, or the like. The material of polymer layer 42 may be photo sensitive, although non-photo-sensitive materials may also be used. Polymer layers 36 and 42 may be formed of a same type of polymer, or may be formed of different types of polymers.

PPI 50 is formed over polymer layer 42, and is electrically connected to PPI 38 and integrated circuit 12. PPI 50 includes a plurality of redistribution lines. In accordance with some embodiments of the present disclosure, PPI 50 is in molding compound 52, which encircles PPI 50, and contacts the top surface of polymer layer 42. The top surfaces and sidewalls of PPI 50 may also be in physical contact with molding compound 52.

In accordance with some embodiments of the present disclosure, electrical connectors 54 are formed to electrically connect to PPI 50. Electrical connectors 54 may include metal regions, which may include solder balls placed on PPI 50. Electrical connectors 54 may also include metal pillars. In the embodiments in which electrical connectors 54 include solder, the solder may be placed or plated, and the plating of solder may be similar to the formation of PPI 38. Electrical connectors 54 have upper portions over the top surface of molding compound 52, and lower portions embedded in molding compound 52. After the formation of electrical connectors 54, wafer 2 may be sawed into individual packages 56, each including one capacitor 46 or a plurality of capacitors 46 and integrated circuit device 12.

In accordance with some embodiments of the present disclosure, capacitor 46 (represented by 46A, 46B, and/or 46C) is formed in one of dielectric layers 18 or in polymer layer 36 or 42. For example, capacitor 46 may be in the top dielectric layer immediately underlying the passivation layer 32, as represented by capacitor 46A. Capacitor 46 may also be in a dielectric layer under the top dielectric layer, as represented by capacitor 46B. Capacitor 46 may also be in a polymer layer such as polymer layer 36 or 42, as represented by capacitor 46C. In accordance with some embodiments of the present disclosure, capacitor 46 is a decoupling capacitor, with the top electrode and the bottom electrode of capacitor 46 being electrically coupled to power supply lines such as VDD and VSS, respectively. Accordingly, capacitor 46 is used to filter noise and/or also used as a power storage for reducing the voltage variation resulted from the current-drawn from the power source. In accordance with alternative embodiments of the present disclosure, the top electrode and the bottom electrode of capacitor 46 are connected to signal lines, and capacitor 46 is used to filter noise. The top electrode and the bottom electrode of capacitor 46 are connected to vias, as will be provided in the subsequently discussed process flow. In accordance with alternative embodiments, capacitor 46 is used for other purposes such as in Dynamic Random Access Memory (DRAM) cells.

FIGS. 2 through 14 illustrate the cross-sectional views of intermediate stages in the formation of capacitor 46 in wafer 2 in accordance with some embodiments of the present disclosure. The steps shown in FIG. 2 through 14 are also illustrated schematically in the process flow shown in FIG. 15. The process flow shown in FIGS. 2 through 14 represents the process flow for forming capacitor 46A in dielectric layer 18A as shown in FIG. 1. The concept of the exemplary embodiments may be used for forming capacitors in various layers, as represented by capacitors 46B and 46C in FIG. 1.

Figure 2:
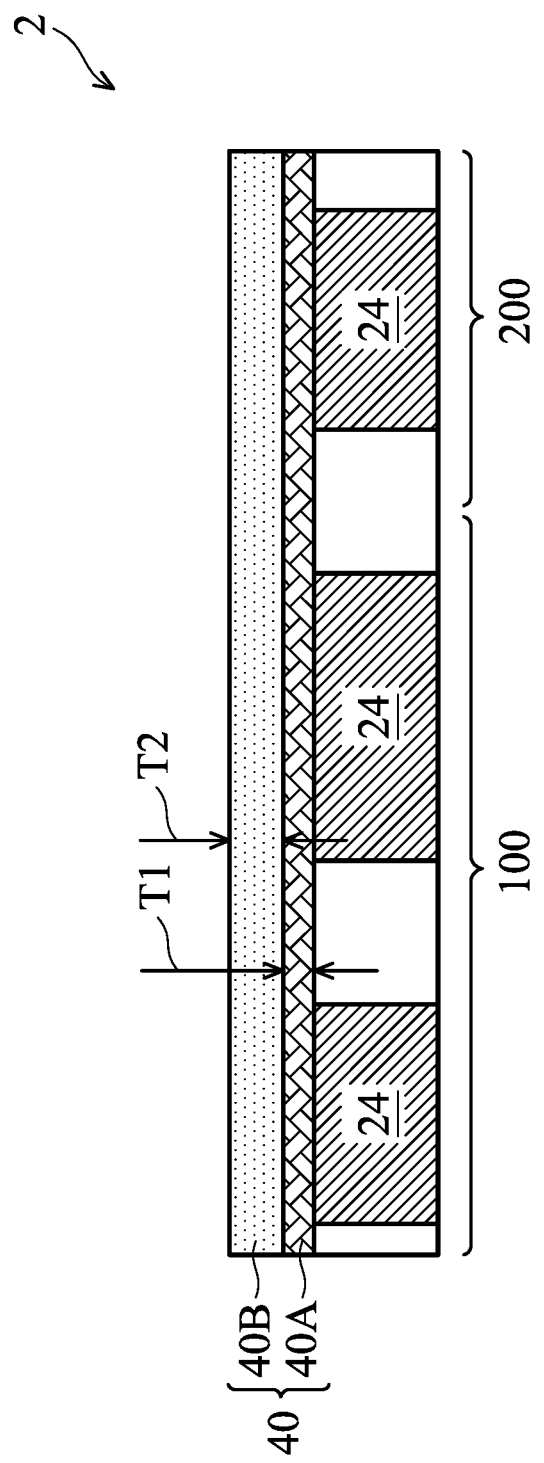

Referring to FIG. 2, wafer 2 includes capacitor region 100 for forming a capacitor, and logic region 200 for forming logic (core) devices 12 (FIG. 1) and the electrical connections connected to logic devices 12. Conductive features 24 are illustrated, and the portions of wafer 2 underlying conductive features 24 are not illustrated, while they still exist as shown in FIG. 1. In accordance with some embodiments in which capacitor 46A (FIG. 1) is to be formed, conductive features 24 are the metal lines or metal pads formed in dielectric layer 18B (FIG. 1). In accordance with some embodiments in which capacitor 46B (FIG. 1) is to be formed, conductive features 24 are the metal lines or metal pads underlying dielectric layer 18B. In accordance with yet other embodiments in which capacitor 46C (FIG. 1) is to be formed, conductive features 24 are metal pads 30 or some portions of PPI 38.

Figure 15:
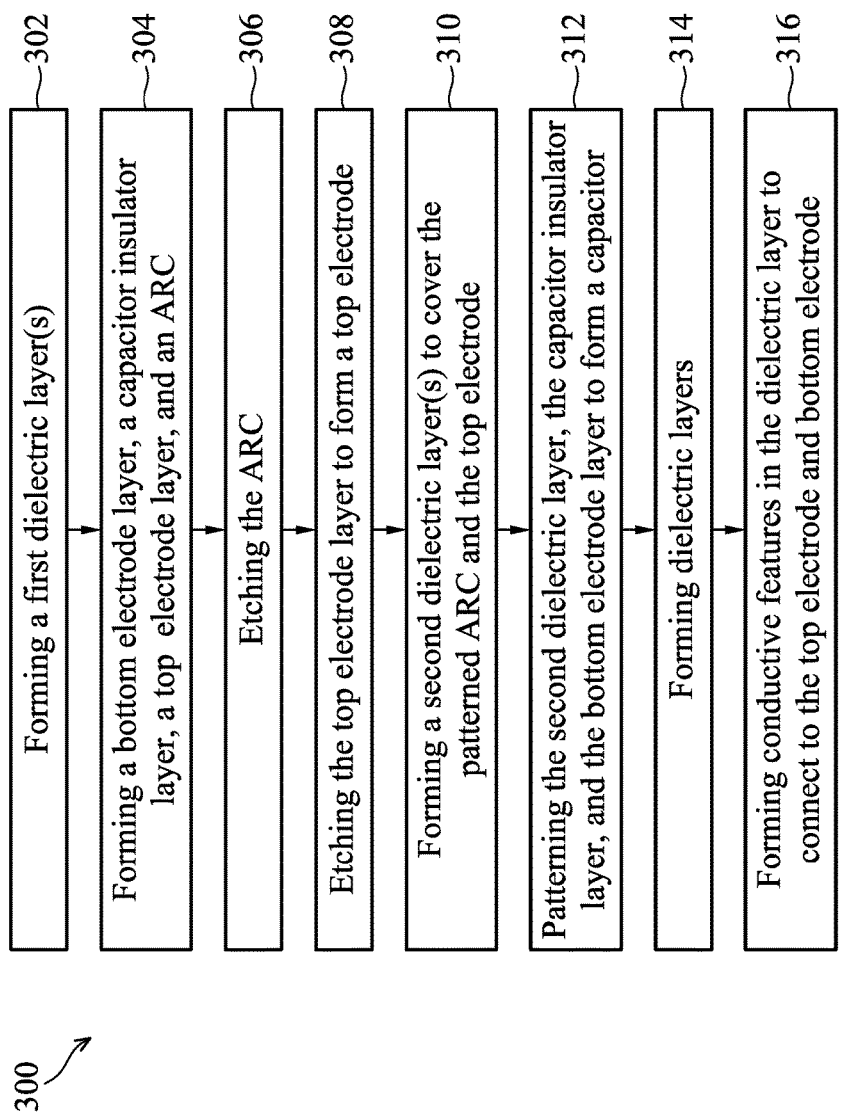
FIG. 15 illustrates a process flow for forming a capacitor in a wafer in accordance with some embodiments.

Dielectric layers 40 are formed over conductive features 24. The respective step is illustrated as step 302 as shown in FIG. 15. Dielectric layers 40 include dielectric layer 40A and dielectric layer 40B over dielectric layer 40A. Dielectric layers 40A and 40B are formed of different materials, which may be inorganic materials in accordance with some embodiments. For example, dielectric layer 40A may be formed of silicon carbide (SiC). Thickness T1 of dielectric layer 40A may be in the range between about 400 Å and about 700 Å. Dielectric layer 40B may be formed of silicon oxide. Thickness T2 of dielectric layer 40B may be in the range between about 800 Å and about 1,200 Å. Dielectric layers 40A and 40B may be formed using Plasma Enhance Chemical Vapor Deposition (PECVD), Low-Pressure Chemical Vapor Deposition (LPCVD), Atomic Layer Deposition (ALD), or the like.

Figure 3:
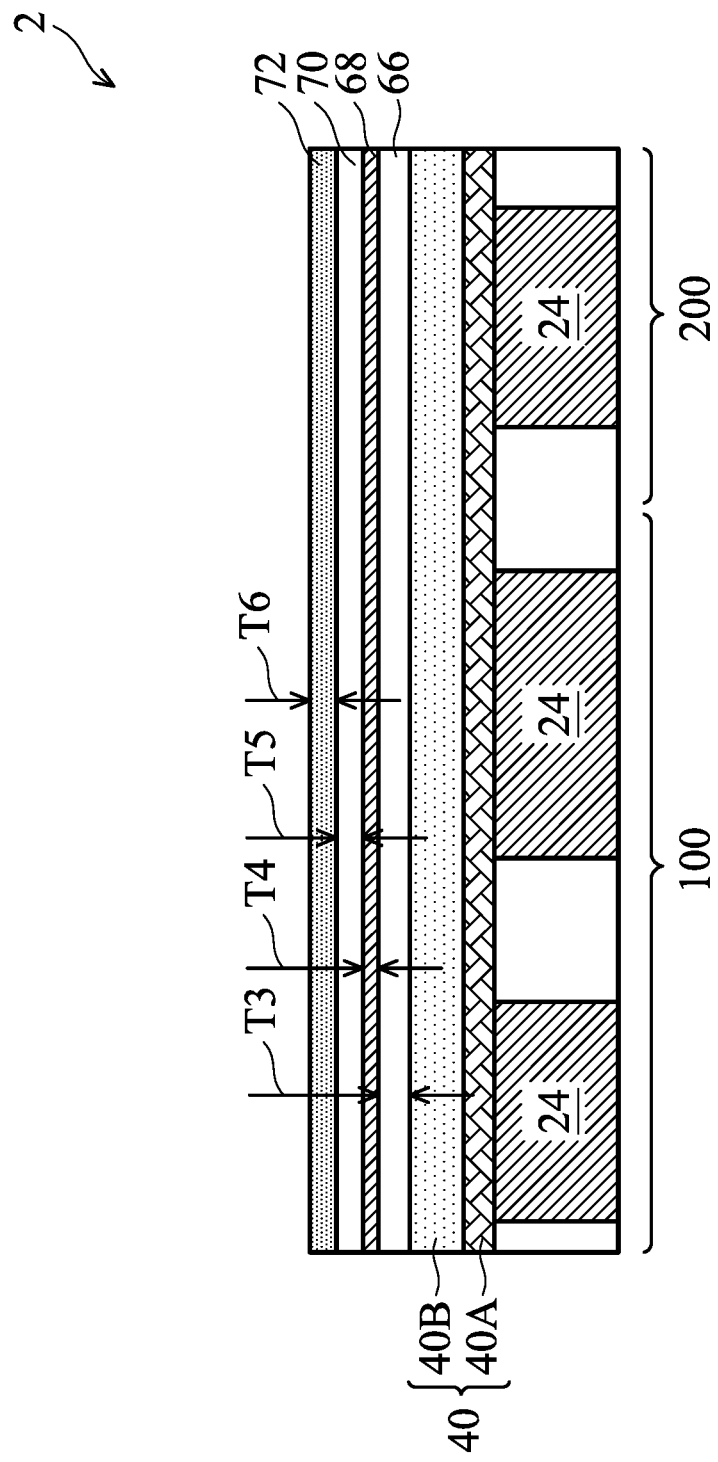

Next, referring to FIG. 3, bottom electrode layer 66, capacitor insulator layer 68, top electrode layer 70, and dielectric layer 72 are formed. The respective step is illustrated as step 304 as shown in FIG. 15. Layers 66, 68, 70, and 72 may be formed as blanket layers. In accordance with some embodiments of the present disclosure, bottom electrode layer 66 is formed of a metal nitride such as titanium nitride (TiN), which may have thickness T3 in the range between about 300 Å and about 500 Å. In accordance with some embodiments of the present disclosure, capacitor insulator layer 68 is a single layer formed of a homogenous dielectric material such as zirconium oxide ($ZrO_2$). In accordance with other embodiments of the present disclosure, capacitor insulator layer 68 is a composite layer formed of stacked dielectric layers. For example, capacitor insulator layer 68 may be formed of $ZrO_2/Al_2O_3/ZrO_2$ (ZAZ), which includes a first $ZrO_2$ layer, an $Al_2O_3$ layer over the first $ZrO_2$ layer, and a second $ZrO_2$ layer over the $Al_2O_3$ layer. ZAZ has the advantageous feature of having a low equivalent oxide thickness, and hence the capacitance value of the resulting capacitor is high. Thickness T4 of capacitor insulator layer 68 may be in the range between about 50 Å and about 90 Å. Top electrode layer 70 may be formed of TiN, which has thickness T5 in the range between about 300 Å and about 500 Å. Dielectric layer 72 may act as an Anti-Reflective Coating (ARC), which may be formed of SiON. Throughout the description, dielectric layer 72 is also referred to ARC 72. Thickness T6 of ARC 72 may be in the range between about 250 Å and about 350 Å.

Figure 4:
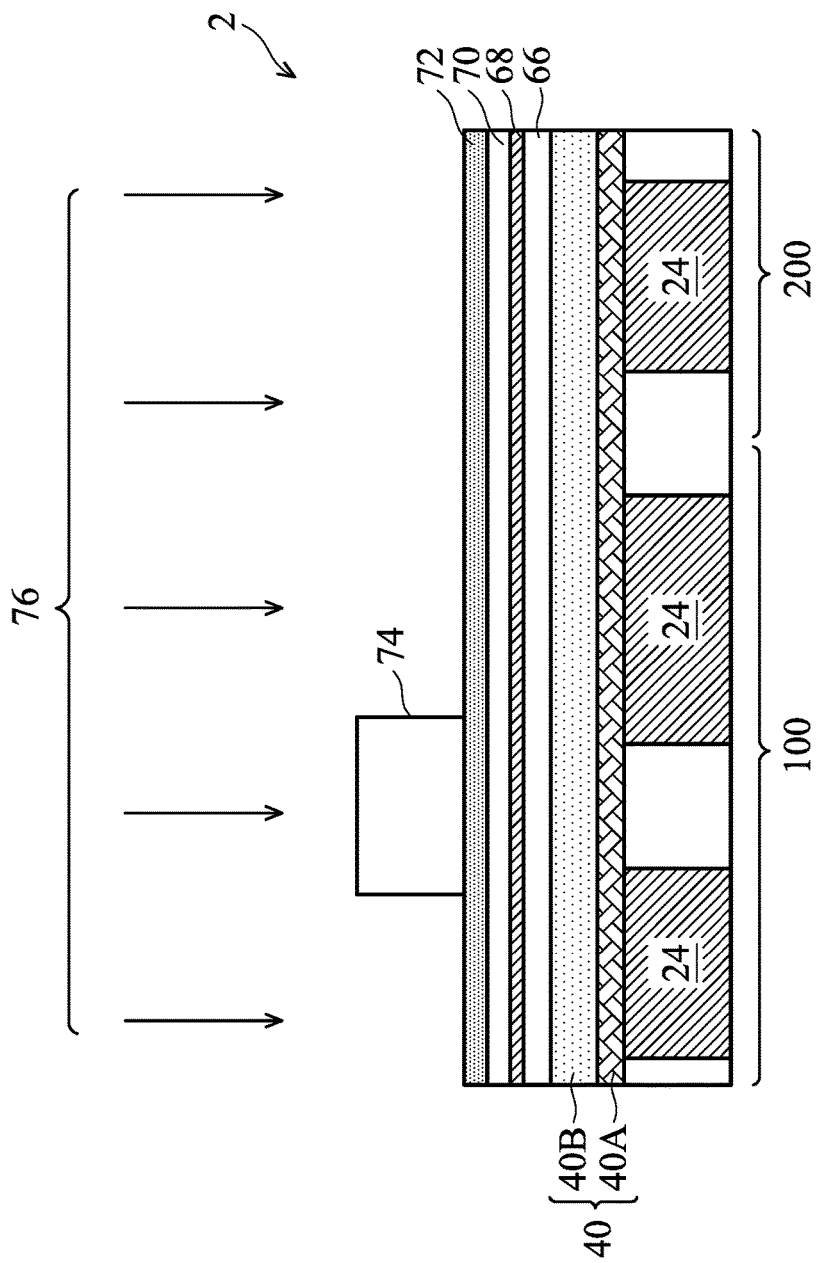
Figure 5:
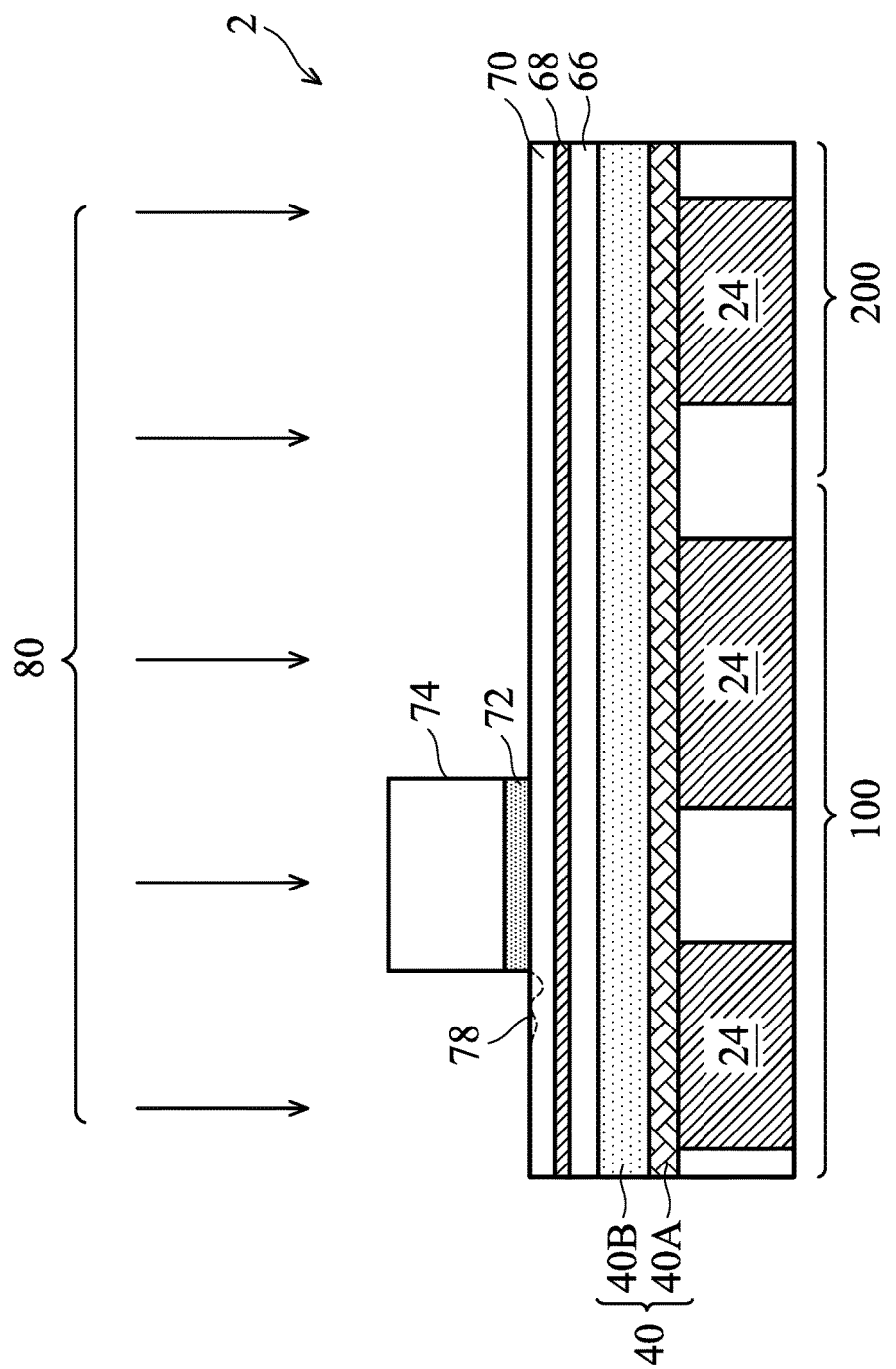

Referring to FIG. 4, patterned photo resist 74 is formed over ARC 72. During the patterning of photo resist 74, ARC 72 may be used as an anti-reflective coating. Next, ARC 72 is etched in an anisotropic etching process, wherein the etching is represented by arrows 76. The respective step is illustrated as step 306 as shown in FIG. 15. The resulting structure is shown in FIG. 5. The etching of ARC 72 may be performed in a dry etching process, in which a fluorine-containing process gas such as $CF_4$ is used. In accordance with some embodiments of the present disclosure, the etching of ARC 72 is formed in a dry etching chamber, wherein the pressure of the process gas may be in the range between about 2 mTorr and about 10 mTorr. The flow rate of the process gas may be in the range between about 20 sccm and about 800 sccm. The source power (used to generate plasma) may be in the range between about 500 Watts and about 700 Watts. The bias power (which may be applied to the chuck of the respective etching tool) may be lower than about 130 Watts, and may be in the range between about 110 Watts and about 130 Watts. The etching may be performed using end-point detection mode. After the signal of the underlying top electrode layer 70 is detected, which means at least some top surfaces of top electrode layer 70 are exposed, an over-etch is performed. The over-etch duration may be shorter than about 25 percent of the main etch duration of ARC 72, wherein the etching of ARC 72 before the over-etch is started is referred to as a main etch step.

It is realized that after top electrode layer 70 is exposed, top electrode layer 70 will also be etched. In accordance with some embodiments of the present disclosure, during the main etch and the over-etch of ARC 72, the etching selectivity is selected to be greater than about 5.0, wherein the etching selectivity is the ratio of the etching rate of ARC 72 to the etching rate of top electrode layer 70. This means the etching rate of ARC 72 is much higher than the etching rate of top electrode layer 70 during the etching of ARC 72.

Due to the process variation and the non-uniformity, during the etching of ARC 72, some exposed portions of top electrode layer 70 are etched deeper than other portions, resulting in the top surface of top electrode layer 70 to be non-planar after the etching of ARC 72 is finished, wherein a portion of the non-planar top surface is schematically illustrated by dashed line 78 in FIG. 5. The topology of the top surface of top electrode layer 70 will be carried into the etching (including the main etch and the over-etch) of layer 70, and further carried into capacitor insulator layer 68. Accordingly, some portions of capacitor insulator layer 68 are etched much more than other portions, resulting in recesses to be generated in capacitor insulator layer 68. The recesses may trap metallic polymer, and causes leakage and breakdown of the resulting capacitor insulator. In conventional etching of ARC layers, the etching selectivity was lower than 1.0, which results in significantly high topology in the underlying top electrode layers.

In addition, the fast etching of some portions of top electrode layer 70 during the etching of ARC 72 also causes undercut in capacitor insulator. FIG. 6B illustrates an amplified view of region 79 in FIG. 6A. As shown in FIG. 6B, the undercut is the etching of some portions of capacitor insulator layer 68 directly underlying the remaining top electrode 70, wherein the undercut occurs in region 81 in FIG. 6B. The undercut may also cause the breakdown of the capacitor insulator.

In accordance with some embodiments of the present disclosure, to reduce the topology of top electrode layer 70, the etching selectivity is selected to be high, for example, higher than about 5.0, and may be in the range between about 5.0 and about 20.0. Accordingly, the exposed portion of top electrode layer 70 is intended to be etched at a low rate, and the top surface of top electrode layer 70 is substantially planar after the etching of ARC 72 is concluded. Experiment results revealed that with the etching rate being greater than about 5.0, all properties of the capacitor including the undercut size, the breakdown voltage of the capacitor, etc., can fall into the specification.

In accordance with some embodiments of the present disclosure, the tuning in the etching selectivity is achieved by adjusting the process gas and etching process condition. For example, the etching process gas may be all $CF_4$, and is free from other fluorine-containing gases such as $CHF_3$. In some exemplary embodiments, the process gas is pure or substantially pure $CF_4$ with a flow rate percentage higher than 99 percent. The partial pressure and the flow rate ratio of $CF_4$ may be higher than about 99 percent among all of the process gas. The bias power may be low to reduce the bombardment effect. Since the bombardment does not differentiate the difference between layers 72 and 70, less bombardment also results in the increase in the etching selectivity.

It is also appreciated that the etching selectivity is affected by the materials of top electrode layer 70 and ARC 72. For example, assuming ARC layer 72 is formed of SiON and top electrode layer 70 is formed of TiN, the atomic percentages of Si, O, and N in SiON and the atomic percentages of Ti and N in TiN also affect the etching selectivity. Accordingly, when one SiON layer has atomic percentages of Si, O, and N different from the corresponding atomic percentages of Si, O, and N in another SiON layer, etching rates of these two SiON layers may be different, and the corresponding etching selectivity values will be different from each other. Experiments hence may need to be performed to determine the actually etching selectivity. In the experiments, a plurality of sample wafers is made to have the same layers and materials as in FIG. 4, and process gases and etching process conditions are adjusted to etch ARCs 72 in the sample wafers in order to find an optimum process gas and optimum process conditions for etching ARC 72, so that the etching selectivity may be maximized.

Further referring to FIG. 5, top electrode layer 70 is etched to form a top electrode in region 100, wherein the top electrode is also referred to as top electrode 70. The respective step is illustrated as step 308 as shown in FIG. 15. Arrows 80 represent the etching of top electrode layer 70. The resulting structure is shown in FIG. 6A. The etching is performed using photo resist 74 (FIG. 5) as the etching mask. The process gas and the process conditions are different from the process gas and the process conditions, respectively, for etching ARC 72. In accordance with some embodiments of the present disclosure, the etching of top electrode layer 70 is performed in the same etching chamber for etching ARC 72. The process gas may include a chlorine-based process gas such as chlorine ($Cl_2$) and a fluorine-containing gas such as $CHF_3$. In accordance with some exemplary embodiments, the pressure of the process gas is in the range between about 5 mTorr and about 10 mTorr. The flow rate of the process gas may be in the range between about 20 sccm and about 800 sccm, wherein the chlorine-based base gas may have a percentage (flow-rate percentage) in the range between about 70 percent and about 90 percent, and the fluorine-based base gas may have a percentage in the range between about 10 percent and about 30 percent. The source power (used to generate plasma) may be in the range between about 1,000 Watts and about 1,500 Watts. The bias power may be in the range between about 80 Watts and about 100 Watts. The main etch of top electrode layer 70 may be performed using end-point detection mode.

After the end point of the underlying capacitor insulator layer 68 is detected, which means at least some top surfaces of capacitor insulator layer 68 are exposed, an over-etch is performed. The over-etch duration may be in the range between about 35 percent and about 45 percent of the main etch duration of top electrode layer 70.

In accordance with some embodiments, as shown in FIGS. 6A and 6B, by adopting the etching method as described in accordance with the embodiments of the present disclosure, the edges of top electrode 70 are substantially straight and vertical. Alternatively, top electrode 70 may have a footing profile as shown in FIG. 6B, wherein edge 70A of top electrode 70 is substantially straight and slanted, and the lower portions of top electrode 70 are increasingly wider than the respective upper portions. The tilt angle α may be smaller than about 85 degrees or 80 degrees, for example.

Figure 7:
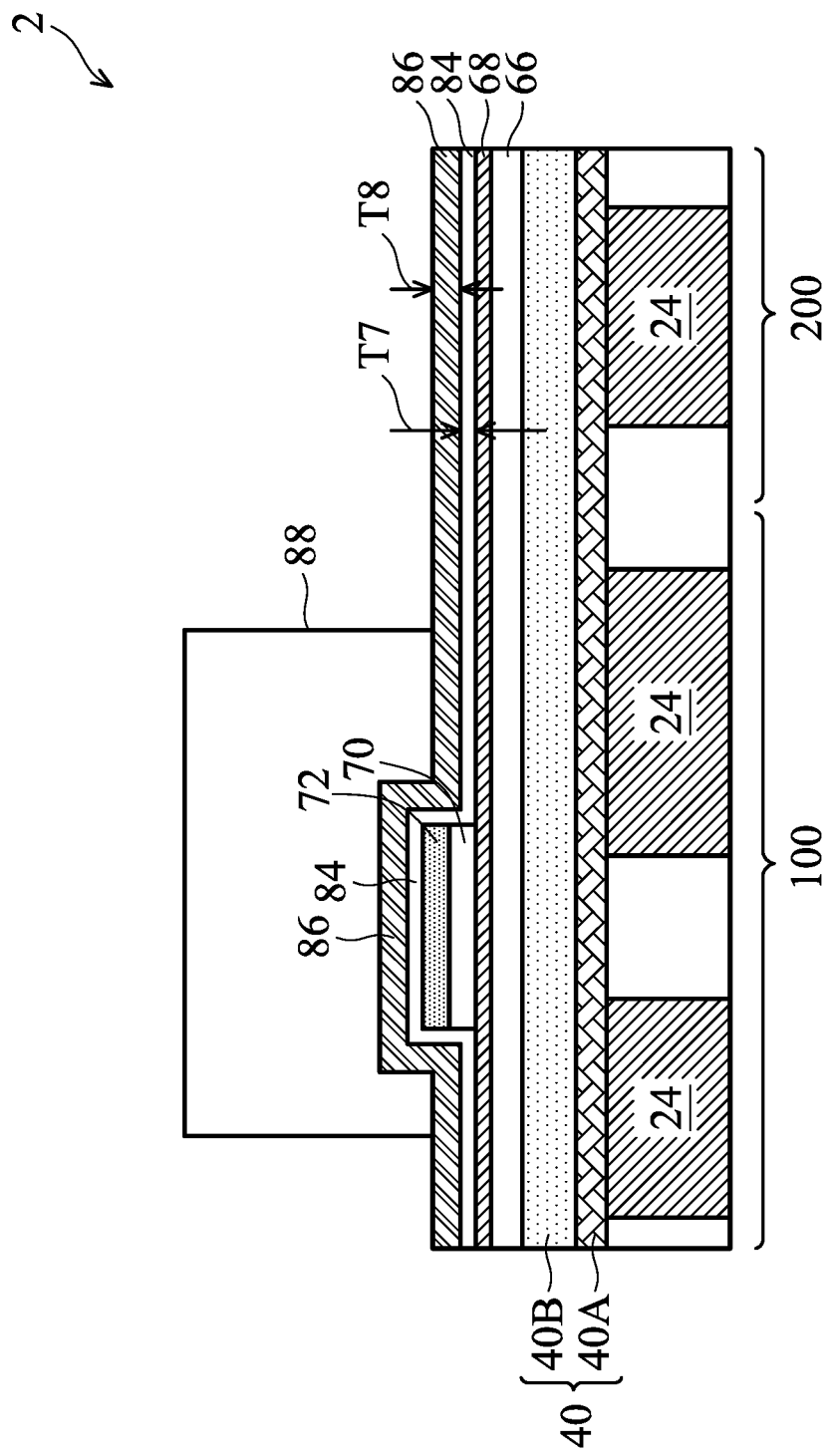

Next, as shown in FIG. 7, one or a plurality of dielectric layers is formed. The respective step is illustrated as step 310 as shown in FIG. 15. FIG. 7 illustrates the exemplary dielectric layers 84 and 86. In accordance with some exemplary embodiments of the present disclosure, dielectric layer 84 is formed of silicon oxide, which has thickness T7 in the range between about 150 Å and about 250 Å. Dielectric layer 86 may be formed of SiN, which has thickness T8 in the range between about 400 Å and about 600 Å. Patterned photo resist 88 is then formed over dielectric layer 86.

Figure 8:
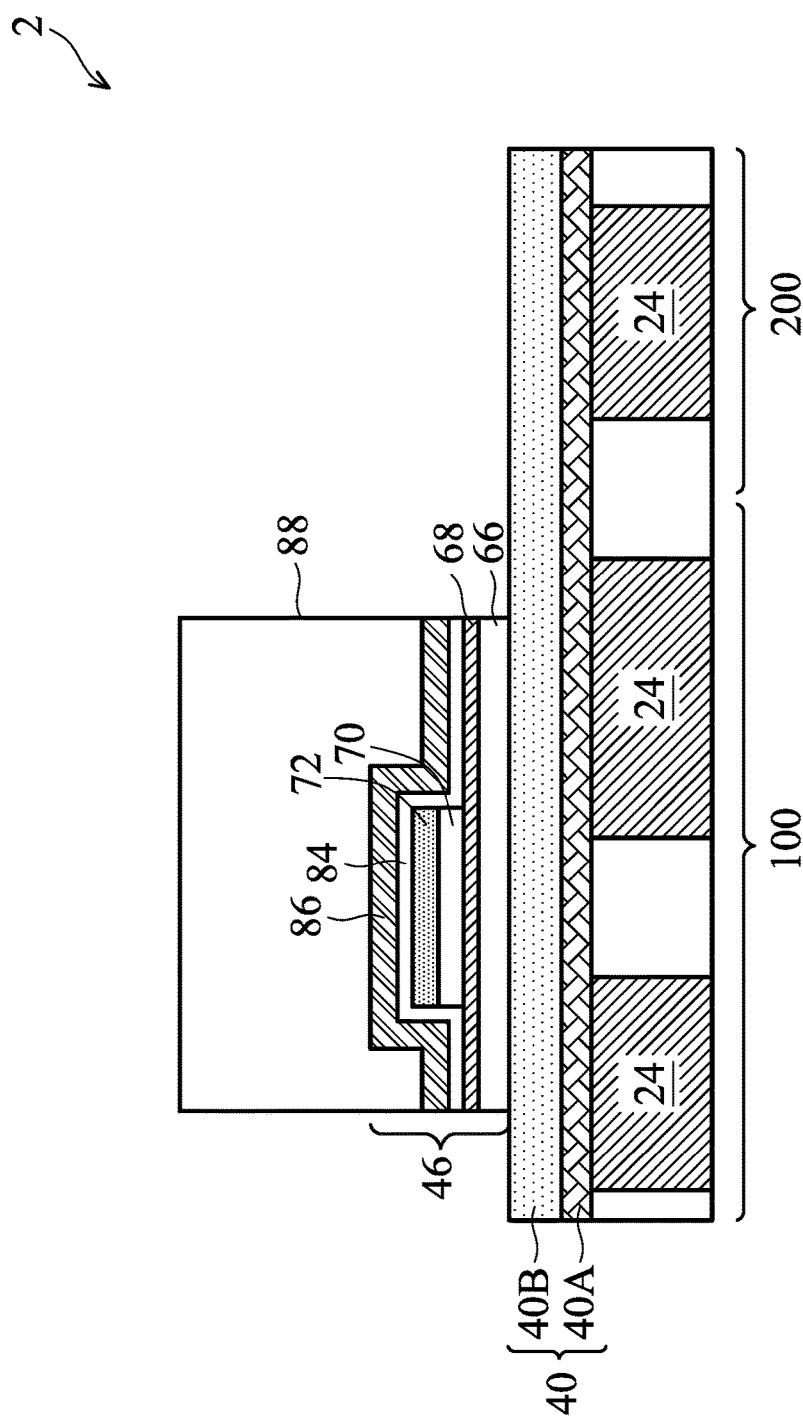

FIG. 8 illustrates the further patterning of layers 66, 68, 84, and 86 in an etching process. The respective step is illustrated as step 312 as shown in FIG. 15. The patterned layers in capacitor region 100 form capacitor 46. In capacitor 46, layers 66, 68, and 70 are bottom capacitor electrode, capacitor insulator, and top capacitor electrode, respectively. Capacitor 46 is thus a Metal-Insulator-Metal (MIM) capacitor. Patterned photo resist 88 is then removed.

Figure 9:
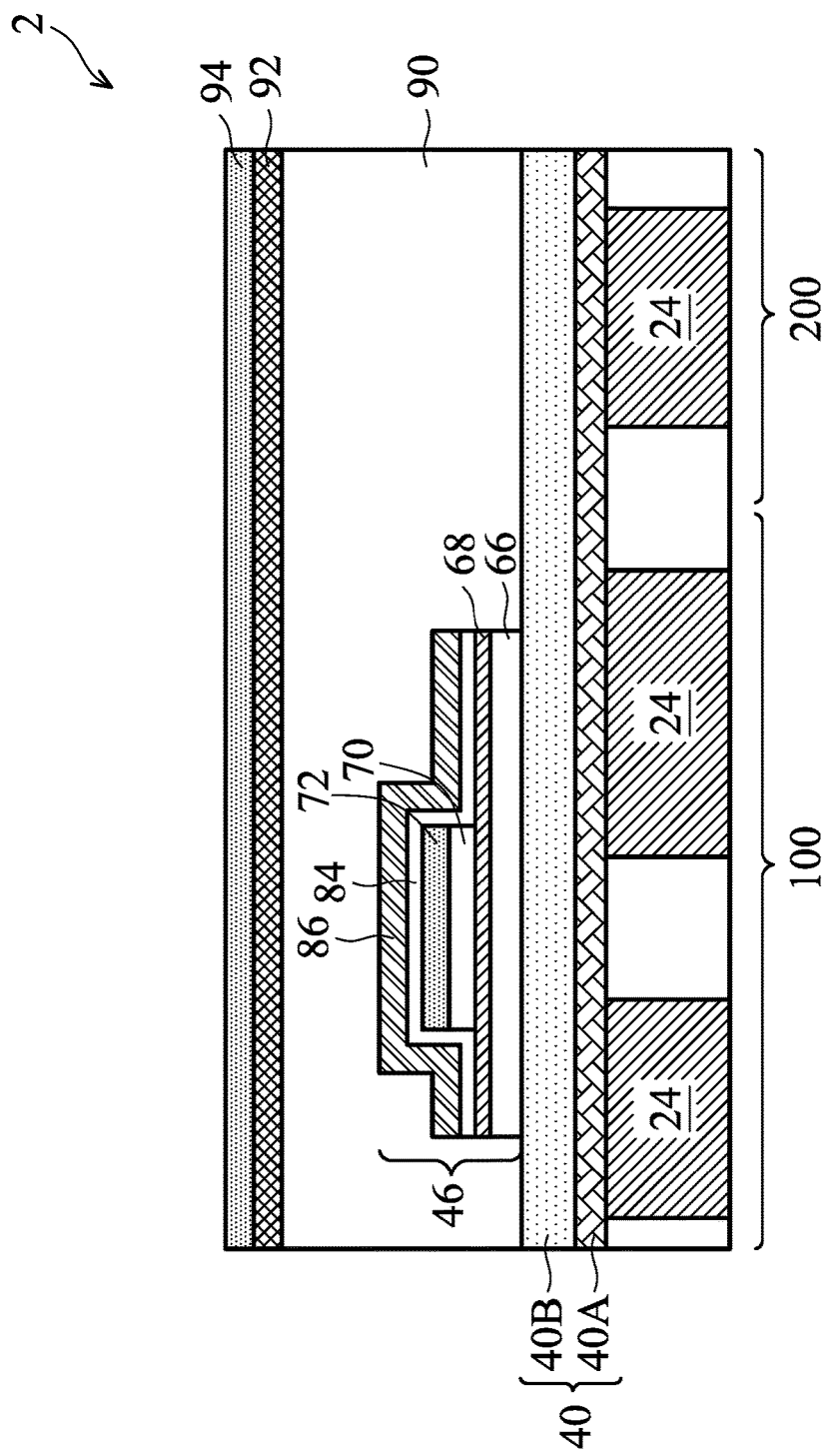

Next, as shown in FIG. 9, dielectric layer 90 is formed, and is then planarized. Dielectric layer 90 may be formed of a low-k dielectric material when capacitors 46A or 46B (FIG. 1) are formed. Alternatively, dielectric layer 90 may be polymer layer 36 or 42 in the embodiments shown in FIG. 1. Dielectric layer 90 may have a thickness in the range between about 2 kÅ and about 5 kÅ. Over dielectric layer 90 is further formed of hard mask layer 92 and anti-reflective coating 94. In accordance with some embodiments, hard mask layer 92 is formed of SiN, and has a thickness in the range between about 400 Å and about 600 Å. Anti-reflective coating 94 may be formed of SiON, and may have a thickness in the range between about 500 Å and about 700 Å.

Figure 10:
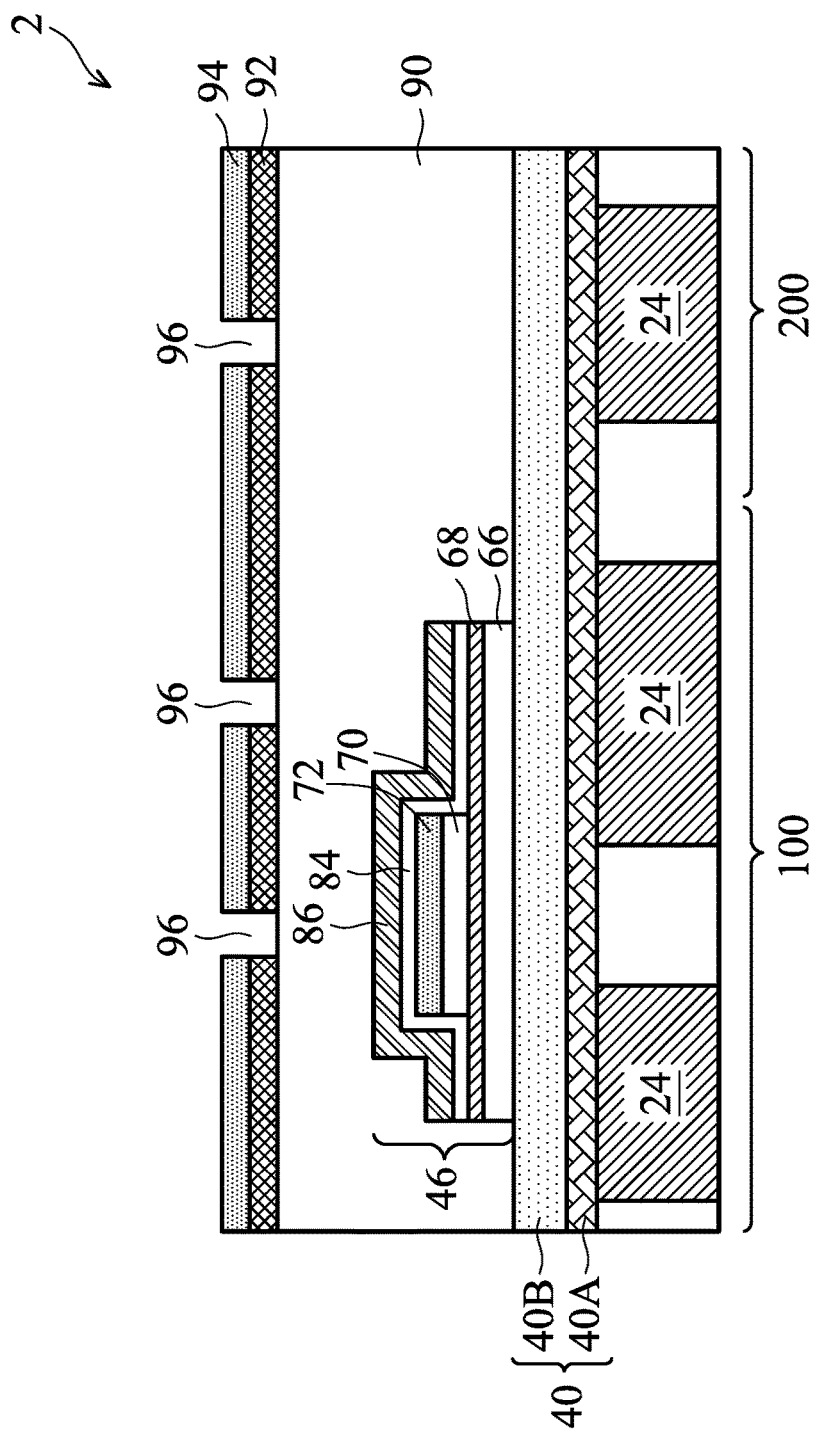
Figure 11:
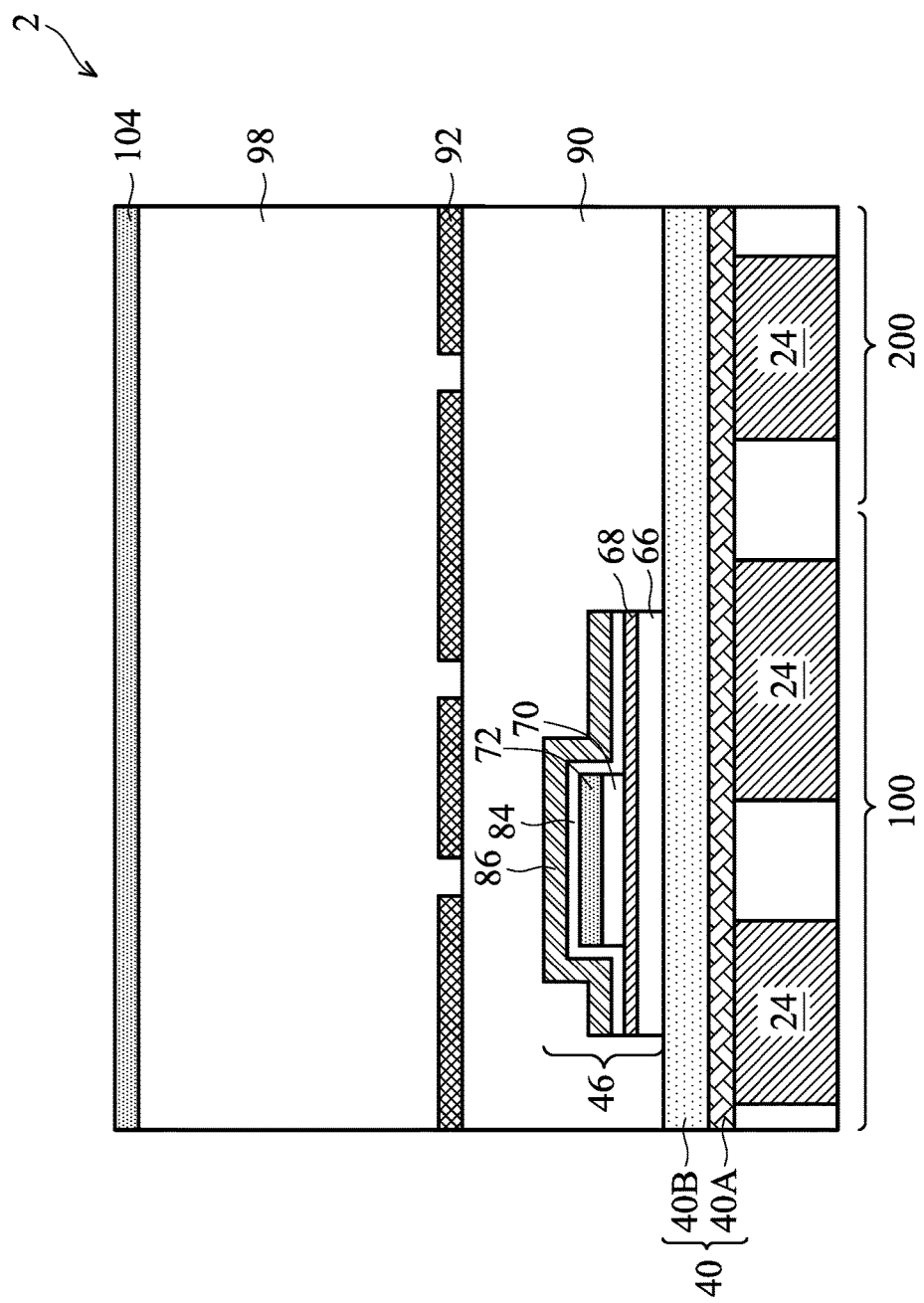

Hard mask layer 92 is then patterned, followed by the removal of anti-reflective coating 94. The resulting structure is shown in FIG. 10. Openings 96 are thus formed in hard mask layer 92, exposing the underlying dielectric layer 90. In a subsequent step, as shown in FIG. 11, dielectric layer 98 is formed. Dielectric layer 98 may have a thickness in the range between about 25 kÅ and about 45 kÅ. The formation of dielectric layers 90, 92, and 98 is illustrated as step 314 in the process flow shown in FIG. 15. Dielectric layers 90 and 98 may be formed of the same dielectric material or different dielectric materials. Anti-reflective coating 104 is formed over dielectric layer 98, and may be formed of SiON. Anti-reflective coating 104 may have a thickness in the range between about 500 Å and about 700 Å.

Figure 12:
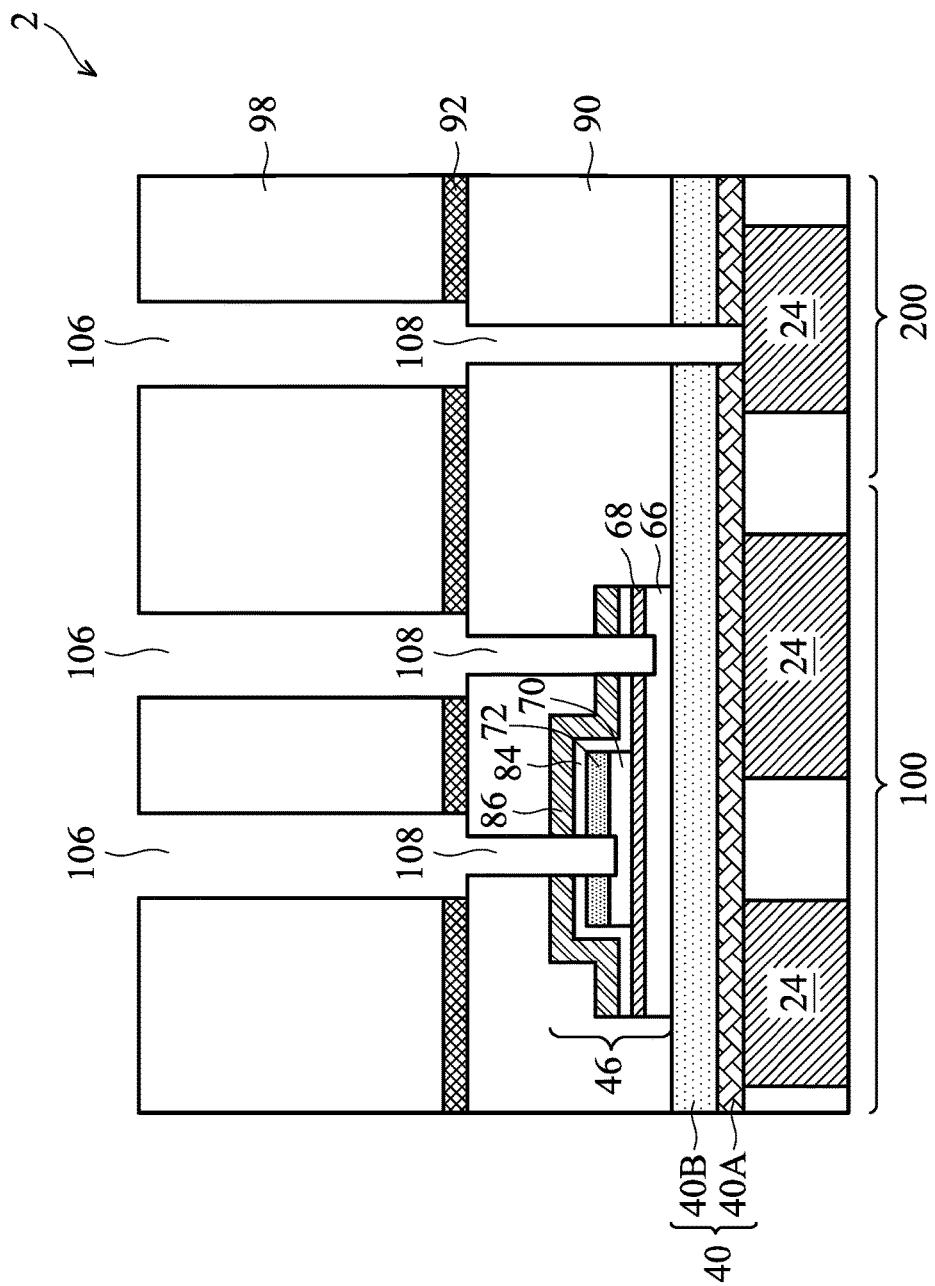

Referring to FIG. 12, a photo lithography process is performed. Anti-reflective coating 104 (FIG. 11), dielectric 98, hard mask layer 92, and dielectric layer 90 are patterned to form trenches 106 in dielectric layer 98 and via openings 108 in dielectric layer 90. The patterns of via openings 108 are defined by the patterns of hard mask layer 92, and are defined by the sizes and the locations of openings 96 (FIG. 10). Accordingly, trenches 106 and via openings 108 may be formed in the same etching process. Top electrode 70 and bottom electrode 66 are exposed to via openings 108. One of conductive features 24 in logic region 200 is exposed to one of openings 108.

Figure 13:
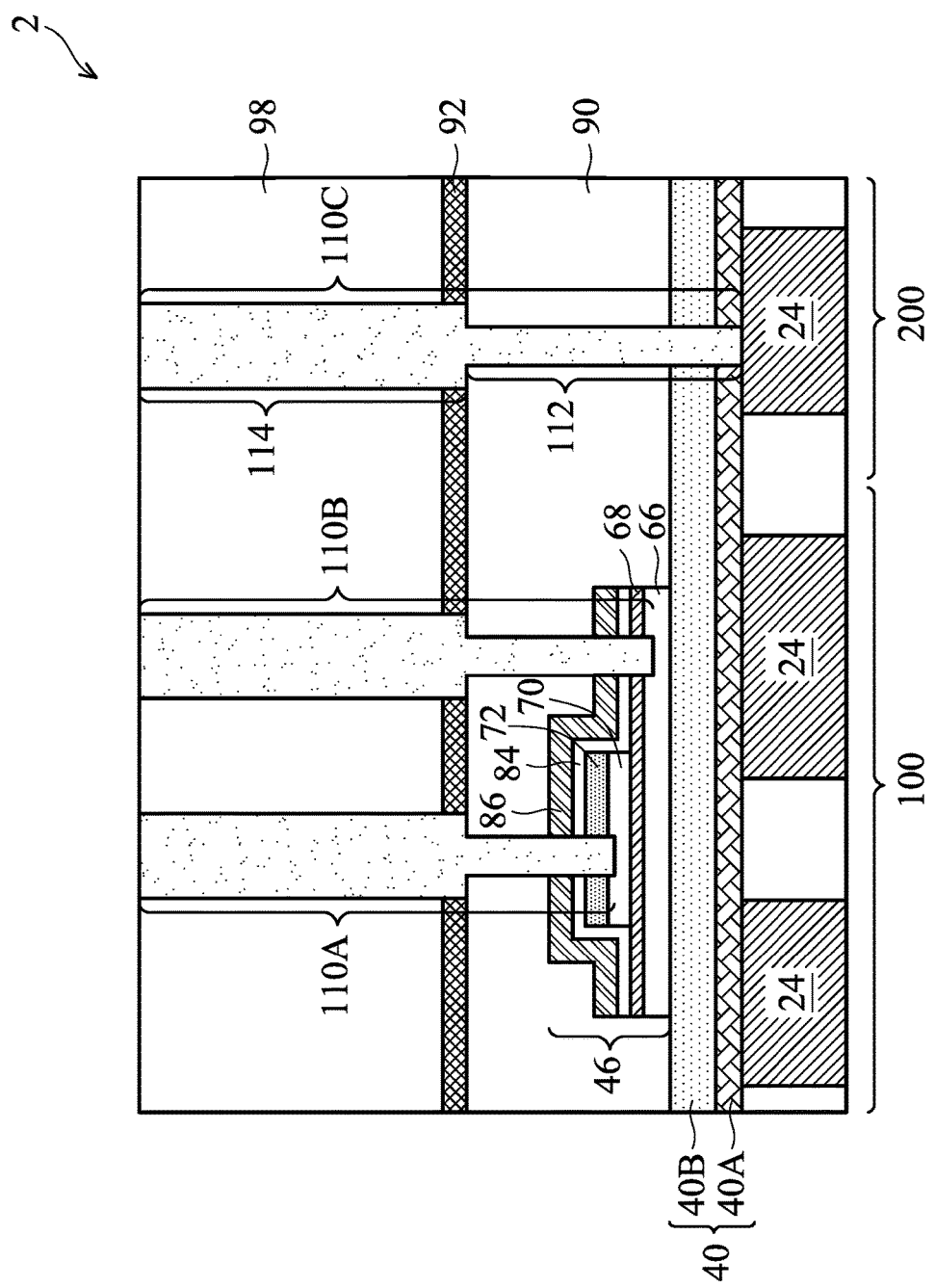

FIG. 13 illustrates the formation of conductive features 110A, 110B, and 110C, which are formed by filling trenches 106 and via openings 108 with a diffusion barrier layer, and a conductive material over the diffusion barrier layer. The diffusion barrier layer may be formed titanium, titanium nitride, tantalum, or tantalum nitride. The conductive material may be formed of copper, aluminum, tungsten, cobalt, or alloys thereof. The respective step is illustrated as step 316 as shown in FIG. 15. The filling may be performed by selective plating such as electro-less plating. Conductive features 110A, 110B, and 110C are electrically connected to top electrode 70, bottom electrode 66, and conductive feature 24, respectively.

As shown in FIG. 13, conductive features 110A, 110B, and 110C include upper portions in dielectric layer 98 and lower portions in dielectric layer 90. The upper portions may further penetrate through hard mask layer 92 and slightly extend into dielectric layer 90. Conductive feature 110C includes via 112 and metal line 114, which connects integrated circuit 12 to overlying metal pad 30 (FIG. 1).

Figure 14:
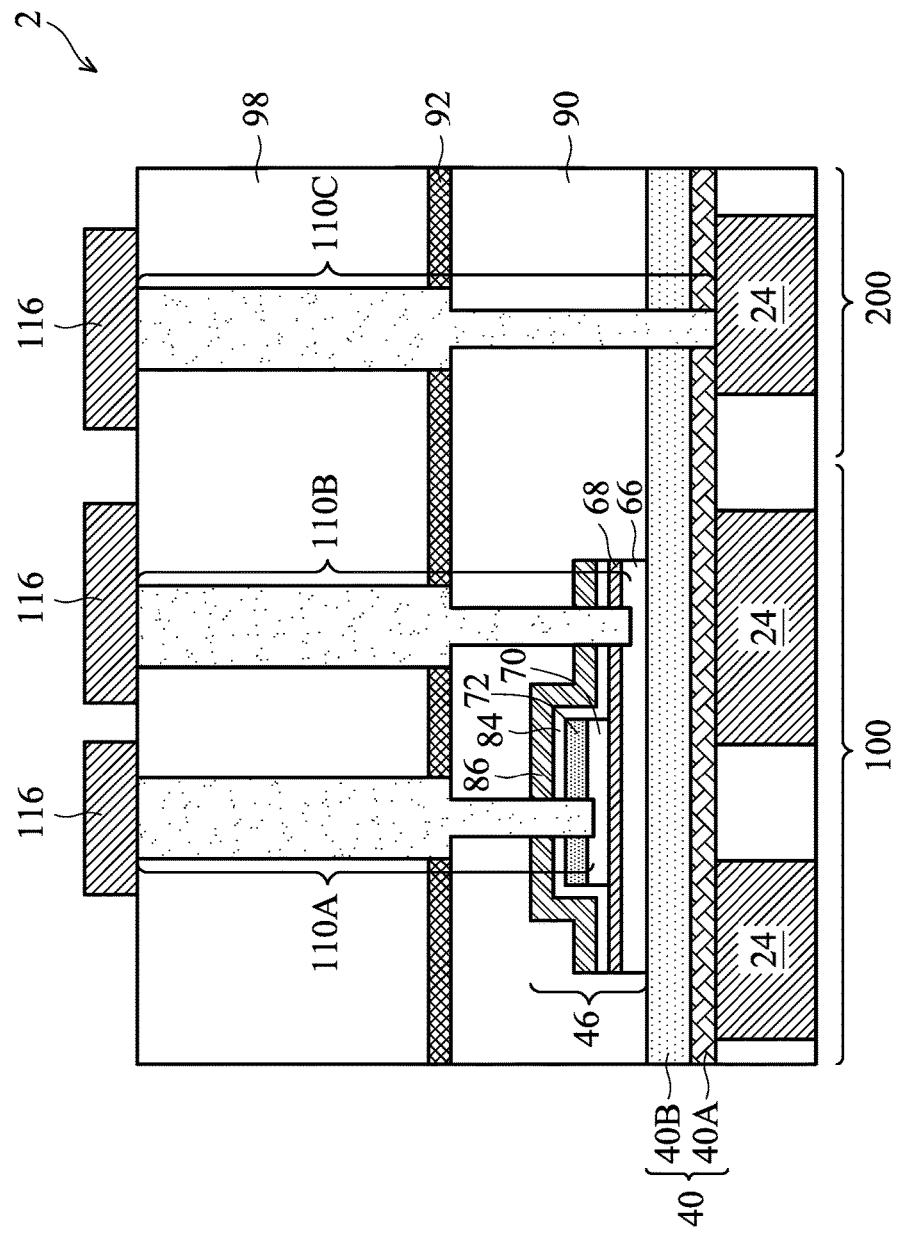

After the formation of the structure in FIG. 13, further process may be performed to form conductive features 116, as shown in FIG. 14. Conductive features 116 may be metal pads 30, PPI 38, or PPI 50, depending on where capacitor 46 is located. Conductive features 116 may be connected to power supplies such as VDD and VSS.

The embodiments of the present disclosure have some advantageous features. By increasing the etching selectivity of the ARC and the top electrode layer during the etching of the ARC, the top surface profile of the capacitor insulator is made more planar and having less undercut. The reliability of the capacitor is thus improved. In addition, by increasing the etching selectivity, the top electrode of the capacitor may have a footing profile, with the lower parts increasingly wider than the respective upper parts, and hence the possibility of generating kinks is reduced.

In accordance with some embodiments of the present disclosure, a method includes forming a capacitor, which includes depositing a bottom electrode layer, depositing a capacitor insulator layer over the bottom electrode layer, depositing a top electrode layer over the capacitor insulator layer, and depositing a dielectric layer over the top electrode layer. The dielectric layer is etched using a process gas until the top electrode layer is exposed. In the etching of the dielectric layer, the dielectric layer has a first etching rate, and the top electrode layer has a second etching rate, and a ratio of the first etching rate to the second etching rate is higher than about 5.0.

In accordance with some embodiments of the present disclosure, a method includes depositing a bottom electrode layer on a wafer, depositing a capacitor insulator layer over the bottom electrode layer, depositing a top electrode layer over the capacitor insulator layer, depositing a dielectric layer over the top electrode layer, and etching the dielectric layer using a first process gas. The first process gas includes $CF_4$, and is substantially free from additional carbon-and-fluorine-containing gases. The top electrode layer is then etched using a second process gas to form a top electrode. The second process gas includes fluorine, and is substantially free from $CF_4$. A capacitor insulator layer is exposed after the top electrode layer is etched.

In accordance with some embodiments of the present disclosure, a method includes depositing a bottom electrode layer on a wafer, depositing a capacitor insulator layer over the bottom electrode layer, depositing a top electrode layer over the capacitor insulator layer, depositing a dielectric layer over the top electrode layer, and etching the dielectric layer using a first process gas until the top electrode layer is exposed. The top electrode layer is then etched using a second process gas to form a top electrode. The top electrode has a footing profile, with lower portions of the top electrode being increasingly wider than respective upper portions of the top electrode. An additional dielectric layer is formed to cover the top electrode and a remaining portion of the dielectric layer. The additional dielectric layer, the capacitor insulator layer, and the bottom electrode layer are patterned to form a capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a capacitor comprising:
depositing a bottom electrode layer;
depositing a capacitor insulator layer over the bottom electrode layer;
depositing a top electrode layer over the capacitor insulator layer;
depositing a first dielectric layer over the top electrode layer;
etching the first dielectric layer using a first etching gas until the top electrode layer is exposed, wherein the first dielectric layer is etched using a first etching mask;
etching the top electrode layer using the first etching mask to form a top electrode;
despositing a second dielectric layer over the top electrode; and
etching the second dielectric layer, the capacitor insulator layer and the bottom electrode layer using a same second etching mask to form a capacitor insulator and a bottom electrode, respectively; and
forming a top contact penetrating through the first dielectric layer to contact the top electrode.

2. The method of claim 1, wherein the etching the first dielectric layer and the etching the top electrode layer are performed using different etching gases.

3. The method of claim 1, wherein in the etching the first dielectric layer, the first dielectric layer has a first etching rate, and the top electrode layer has a second etching rate, and a ratio of the first etching rate to the second etching rate is higher than about 5.0.

4. The method of claim 1, wherein the etching the top electrode layer results in a remaining portion of the top electrode layer to be left as the top electrode, and the top electrode has a footing profile, with lower portions of the top electrode being increasingly wider than respective upper portions of the top electrode.

5. The method of claim 1, wherein the etching the first dielectric layer comprises applying a bias power lower than about 130 Watts.

6. The method of claim 1, wherein the first dielectric layer is etched using substantially pure CF4.

7. The method of claim 6, wherein the top electrode layer is etched using an etching gas comprising CHF3 and chlorine (Cl2).

8. A method comprising:
depositing a bottom electrode layer on a wafer;
depositing a capacitor insulator layer over the bottom electrode layer;
depositing a top electrode layer over the capacitor insulator layer;
depositing a first dielectric layer over the top electrode layer;

etching the first dielectric layer using a first etching gas, wherein the first etching gas comprises CF4, and is substantially free from additional carbon-and-fluorine-containing gases;

etching the top electrode layer using a second etching gas to form a top electrode;

forming a second dielectric layer on a top surface of the first dielectric layer and sidewalls of the top electrode; and etching the second dielectric layer, the capacitor insulator layer, and the bottom electrode layer using a same etching mask.

9. The method of claim 8, wherein the first etching gas is different from the second etching gas.

10. The method of claim 9, wherein the first dielectric layer and the top electrode layer are etched using a same etching mask.

11. The method of claim 8, wherein the second etching gas comprises fluorine, and is substantially free from CF4.

12. The method of claim 8, wherein the first dielectric layer has a first etching rate in response to the first etching gas, and the top electrode layer has a second etching rate in response to the first etching gas, and a ratio of the first etching rate to the second etching rate is higher than about 5.0.

13. The method of claim 8, wherein the top electrode has a footing profile.

14. The method of claim 8 further comprising:

forming a plurality of sample wafers having top electrode layers and dielectric layers identical to the top electrode layer and the dielectric layer in the wafer, respectively; and adjusting etching gases and etching process conditions for etching the dielectric layer in the plurality of sample wafers to find a etching gas and an etching process condition that results in an etching selectivity to be higher than about 5.0.

15. The method of claim 8, wherein the etching the first dielectric layer is performed by applying a bias power lower than about 130 Watts.

16. A method comprising:

depositing a bottom electrode layer on a wafer;

depositing a capacitor insulator layer over the bottom electrode layer;

depositing a top electrode layer over the capacitor insulator layer;

depositing a first dielectric layer over the top electrode layer;

etching the first dielectric layer until the top electrode layer is exposed;

etching the top electrode layer to form a top electrode, wherein the top electrode has a footing profile, with lower portions of the top electrode being increasingly wider than respective upper portions of the top electrode;

forming a second dielectric layer covering the top electrode and a remaining portion of the first dielectric layer; and patterning the second dielectric layer, the capacitor insulator layer, and the bottom electrode layer to form a capacitor, wherein remaining portions of the second dielectric layer, the capacitor insulator layer, and the bottom electrode layer extend beyond edges of the remaining portion of the first dielectric layer.

17. The method of claim 16, wherein the etching the first dielectric layer is performed using a first etching gas comprising substantially pure CF4, and the top electrode layer is etched using a second etching gas comprising fluorine and substantially free from CF4.

18. The method of claim 17, wherein during the etching the first dielectric layer, the first dielectric layer has a first etching rate, and the top electrode layer has a second etching rate, and a ratio of the first etching rate to the second etching rate is higher than about 5.0.

19. The method of claim 16, wherein the first dielectric layer is etched using a first etching gas, and the top electrode layer is etched using a second etching gas, wherein the first etching gas comprises CF4 and is free from CHF3, and the second etching gas comprises CHF3 and is substantially free from CF4.

20. The method of claim 19, wherein the first etching gas comprises substantially pure CF4.

* * * * *